United States Patent
Yang

(10) Patent No.: US 10,568,230 B1
(45) Date of Patent: Feb. 18, 2020

(54) SERVER RACK WITH ULTRA-LONG CHASSIS

(71) Applicant: Super Micro Computer Inc., San Jose, CA (US)

(72) Inventor: Chanchi Yang, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 16/382,111

(22) Filed: Apr. 11, 2019

(51) Int. Cl.
  *H05K 5/00* (2006.01)
  *H05K 7/14* (2006.01)
(52) U.S. Cl.
  CPC .................. *H05K 7/1489* (2013.01)
(58) Field of Classification Search
  CPC ...................................................... H05K 5/00
  See application file for complete search history.

(56) References Cited

U.S. PATENT DOCUMENTS

| | | | |
|---|---|---|---|
| 2009/0141457 A1* | 6/2009 | Fujikawa | G06F 1/187 361/727 |
| 2017/0020023 A1* | 1/2017 | Yu | H05K 7/1489 |

* cited by examiner

*Primary Examiner* — Jerry Wu
(74) *Attorney, Agent, or Firm* — Chun-Ming Shih; HDLS IPR Services

(57) ABSTRACT

A structure includes a server rack, one pair of rails and one chassis. The server rack includes supporting columns spaced apart. The rails are disposed at opposite sides of the server rack. The chassis is slidably coupled between the pair of rails; the chassis includes a bottom plate, a pair of first side plates and second side plates. The bottom plate, the first side plates and second side plates are enclosed to form an accommodating space; the first side plates are disposed at opposite sides of the bottom plate. Each second side plate connects with each first side plate and an opposite end thereof is extended to a rear side of the bottom plate at an oblique angle.

4 Claims, 7 Drawing Sheets

SERVER RACK WITH ULTRA-LONG CHASSIS

BACKGROUND OF THE INVENTION

Field of the Invention

The present invention generally relates to a chassis of server rack and, in particular to an ultra-long chassis structure of sever rack.

Description of Prior Art

In order to meet requirements of accessing a large amount of electronic data, server systems nowadays are equipped with a plurality of stacked chassis in a server rack, and each chassis is loaded with electronic devices such as a motherboard, storage devices, power supplies, etc. to facilitate maintenance and expansion of each chassis.

Moreover, the width and length of chassis are increased gradually to meet the installation requirements of storage devices. For a general chassis, when the chassis is stored in the server rack, the rear end of the chassis is still located between the supporting columns of the server rack; besides, the rails are also fixed to the supporting columns of the server rack. However, for a long chassis, when the chassis is stored in the server rack, the rear end of the chassis may even exceed the supporting columns of the server rack; thus, the rear end of the rail will be located beyond the supporting columns of the server rack without supporting and fixing. Therefore, when a long chassis is combined with a rail and positioned together with the rails in the server rack, the portion of the chassis exceeded the supporting columns will press the portion of the rail extended beyond the supporting columns (the end of the rail) because of the thickness of the rear end of the rail (including the rail has inner/middle/outer three layers) and the width of the chassis when the chassis is stored in the server rack. At this time, hence the end of the rail is displaced due to not being supported and fixed and the chassis is loaded with the electronic device, the rollers or balls are pressed by the chassis because of displacement; therefore, the rollers or balls will be stuck, and that will cause the chassis cannot perform an extraction via the rails.

In view of the above drawbacks, the Inventor proposes the present invention based on his expert knowledge and elaborate researches in order to solve the problems of prior art.

SUMMARY OF THE INVENTION

Accordingly, an object of the present invention is to provide a sever rack with ultra-long chassis, in which when the chassis has a long length, the rails can be moved smoothly for facilitating the operation of extracting the chassis.

In order to achieve the object mentioned above, the present invention provides a sever rack with ultra-long chassis including a server rack, at least one pair of rails and at least one chassis. The server rack includes a plurality of supporting columns spaced apart. The pair of rails are disposed at opposite sides of the server rack correspondingly. The chassis is slidably coupled between the pair of rails. The chassis includes a bottom plate, a pair of first side plates and a pair of second side plates. The bottom plate, the pair of first side plates and the pair of second side plates are enclosed to form an accommodating space, and the pair of first side plates are disposed vertically and in parallel at opposite sides of a front side of the bottom plate. One end of each of the pair of second side plates connects with each of the pair of first side plates correspondingly and an opposite end thereof is extended to a rear side of the bottom plate toward an interior of accommodating space at an oblique angle.

Comparing to the prior art, the chassis of the present invention includes a pair of first side plates and a pair of second side plates. The first side plates are disposed at the front side of the chassis, and each second side plate connects with each first side plate correspondingly. The second side plate is extended to a rear side of the bottom plate toward an interior of accommodating space at an oblique angle. Therefore, there will be a gap formed between the second plate and the rail, and the gap can provide a margin of movement for the rail at the rear end of the chassis. Then the rollers or balls of the rails can keep rotating without being stuck for facilitating the extraction of the chassis; thus, the utility of the present invention can be enhanced.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
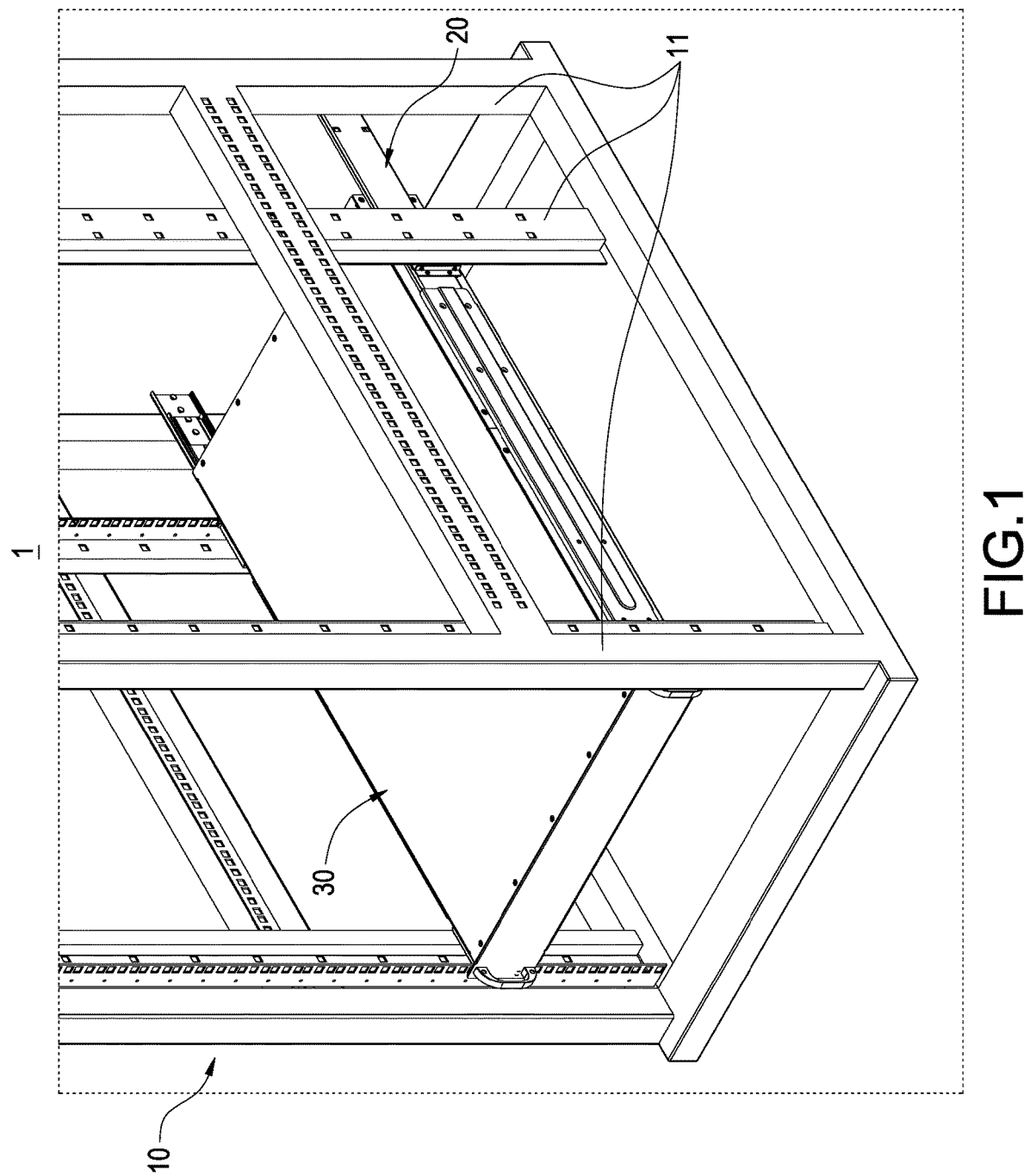
FIG. 1 is a perspective schematic view of sever rack with ultra-long chassis of the present invention.
Figure 2:
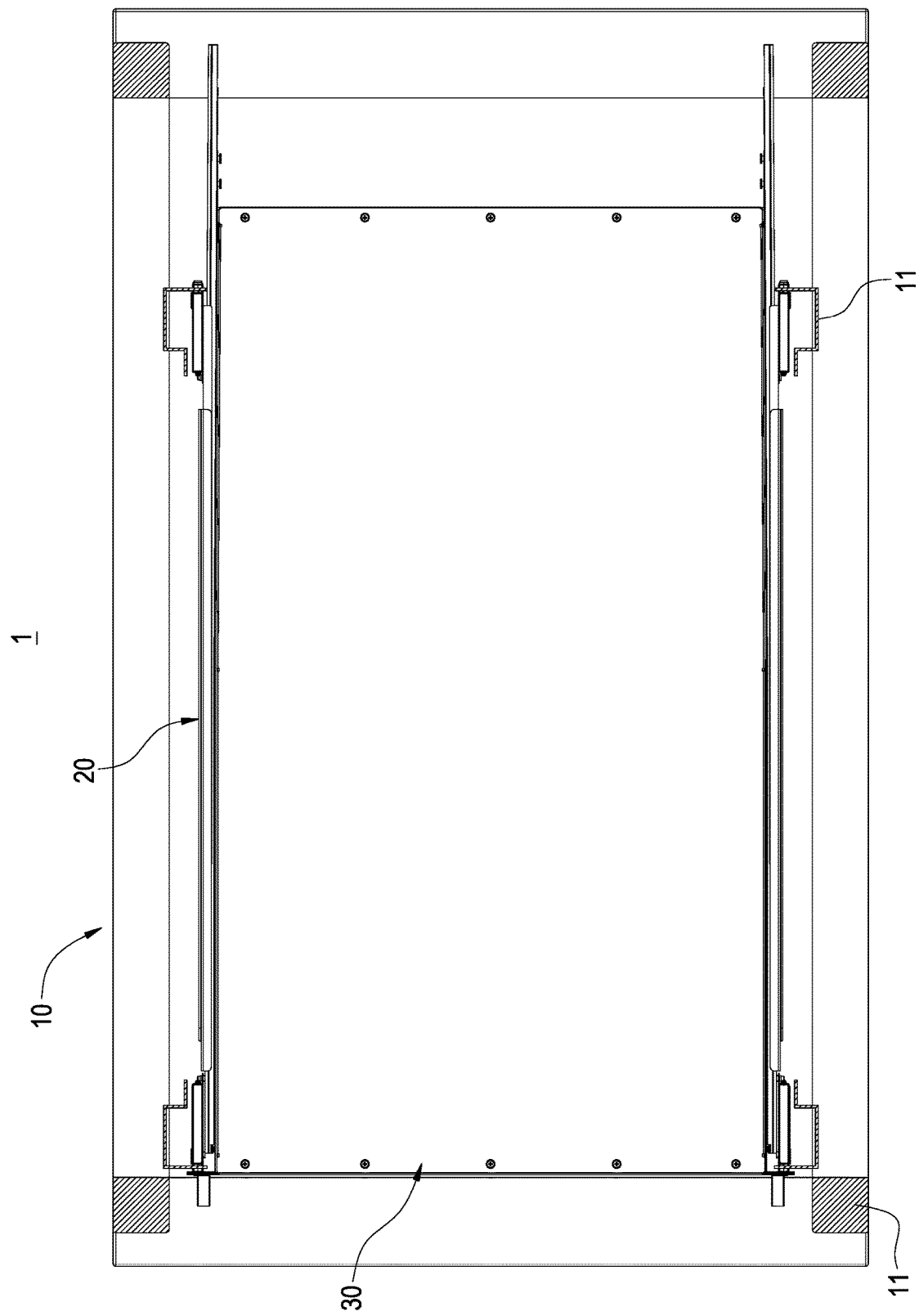
FIG. 2 is a top view of sever rack with ultra-long chassis of the present invention.
Figure 3:
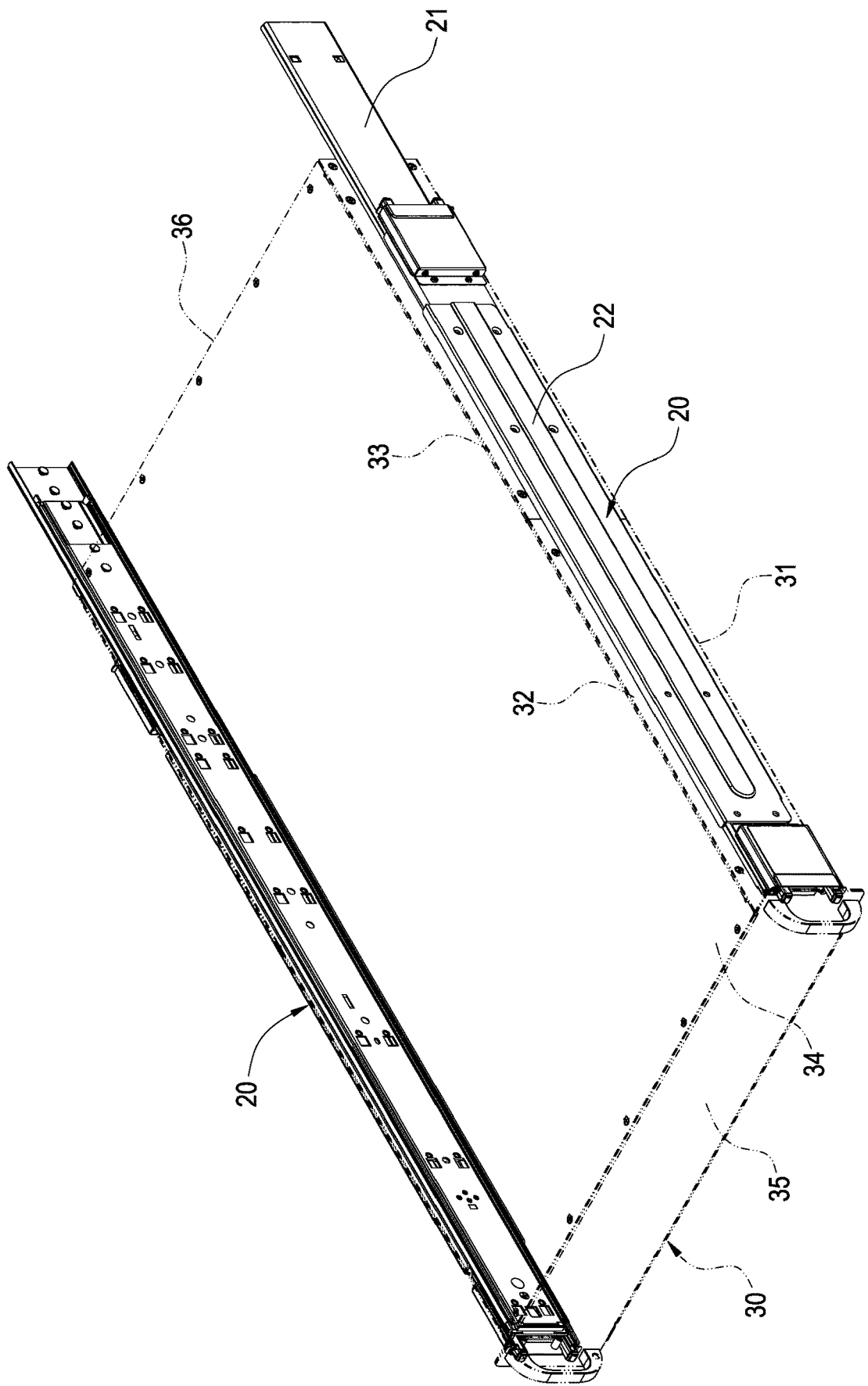
FIG. 3 is a perspective schematic view of combination of chassis and rails of the present invention.
Figure 4:
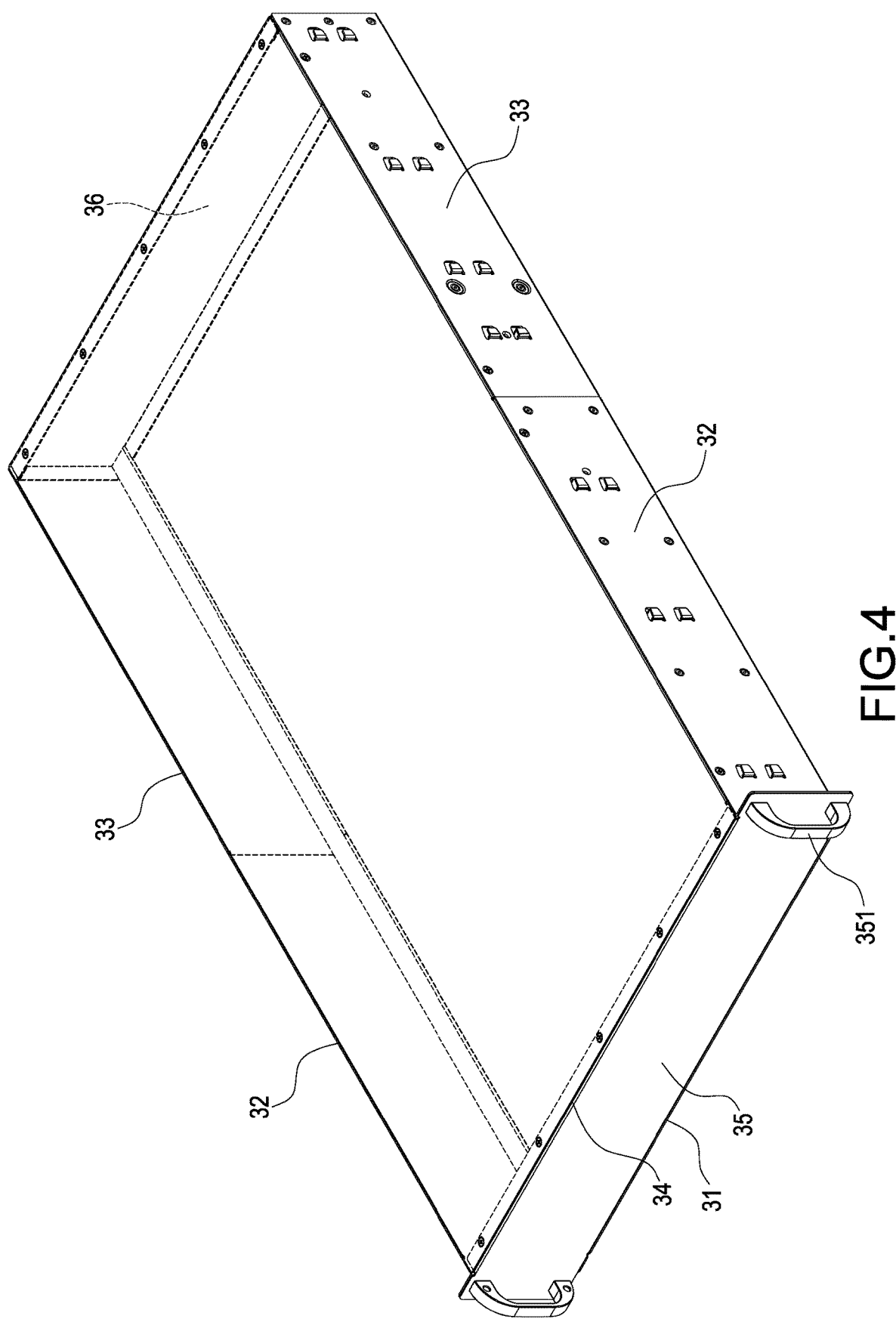
FIG. 4 is a perspective schematic view of sever rack of the present invention.

Please refer to FIG. 1 and FIG. 2, which depict a perspective schematic view and a top view of sever rack with ultra-long chassis of the present invention. As shown in figures, the present invention provides a sever rack with ultra-long chassis 1 including a server rack 10, at least one pair of rails 20 and at least one chassis 30. The pair of rails 20 are disposed in the server rack 10. The server rack 10 can perform a sliding and an extracting motion through the pair pf the rails 20 to configure the sever rack with ultra-long chassis 1. More detail descriptions of the sever rack with ultra-long chassis 1 are as follows The server rack 10 includes a plurality of supporting columns 11 spaced apart. The pair of rails 20 are disposed at opposite sides of the server rack 10 correspondingly.

Besides, the at least one chassis 30 is slidably coupled between the pair of rails 20. In more detail, the pair of rails 20 are extended from a supporting column 11 at the front side of the server rack 10 to a supporting column 11 at the rear side of the server rack 10 along a length direction. In the present embodiment, the side which the chassis 30 is extracted from the server rack 10 is defined as the front side, and the opposite side is defined as the rear side.

Please further refer to FIG. 3 to FIG. 6, they depict a perspective schematic view of combination of sever rack with ultra-long chassis of the present invention, a perspective schematic view of the chassis of the present invention, a top schematic view and a partial enlarged schematic view of combination of chassis and rails of the present invention. In the present embodiment, each of the rails 20 includes an inner rail 21 fixed to the supporting columns 11 and an outer rail 22 sleeved outside of the inner rail 21.

Furthermore, the chassis 30 includes a bottom plate 31, a pair of first side plates 32 and a pair of second side plates 33. The bottom plate 31, the pair of first side plates 32 and the pair of second side plates 33 are enclosed to form an accommodating space 300. The pair of first side plates 32 are disposed vertically and in parallel at opposite sides of a front side of the bottom plate 31. One end of each of the pair of second side plates 33 connects with each of the pair of first side plates 32 correspondingly and an opposite end thereof is extended to a rear side of the bottom plate 31 toward an interior of accommodating space 300 at an oblique angle A (refer to FIG. 6). Preferably, the oblique angle A is set to 0.5 to 1 degree.

Specifically, the chassis 30 further includes a cover plate 34, and the cover plate 34 covers a side of the accommodating space 300 with respect to the bottom plate 31. Preferably, ends of the bottom plate 31 and the cover plate 34 are arranged at the oblique angle, that is, the bottom plate 31 and the cover plate 34 are not rectangular plates but corresponded to the pair of second side plate 33 at the oblique angle A with a slight inward retraction.

In addition, the chassis 10 further includes a front plate 35 and a rear plate 36. The front plate 35 and the rear plate 36 are vertically disposed on opposite sides of the bottom plate 31. The front plate 35, the rear plate 36, the pair of the first side plates 32 and the second side plates 33 enclose a periphery of the accommodating space 300. Two sides of the front plate 35 are provide with a handle separately for a user to grip to perform an extracting motion.

Figure 5:
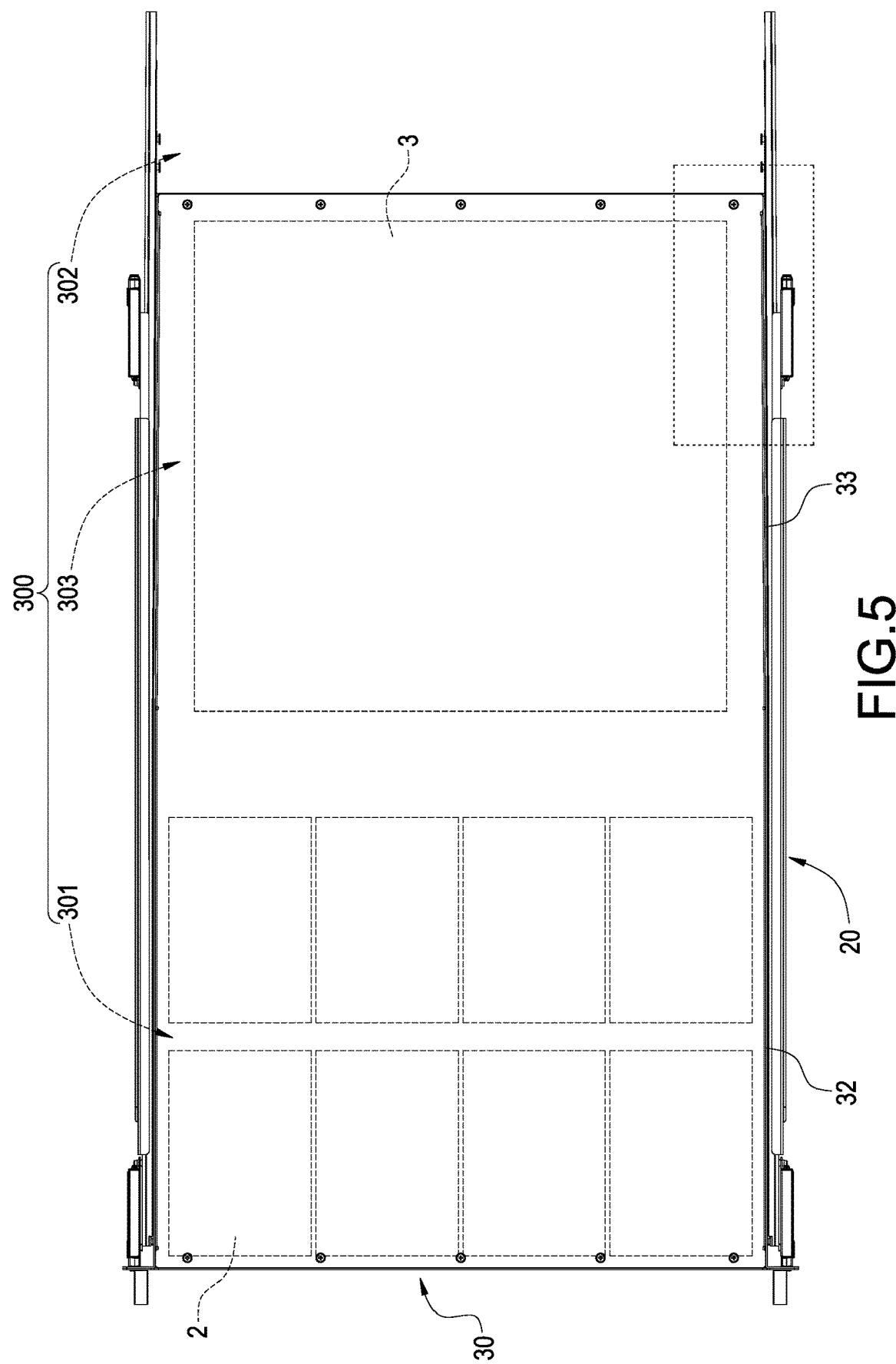
FIG. 5 is a top view of combination of chassis and rails of the present invention.

As shown in FIG. 5, in an embodiment of the present invention, the accommodating space 300 includes a storage device area 301 located at the front side of the server rack 10, a wire area 302 located at the rear side of the server rack 10, and a circuit board area 303 located between the storage device area 301 and the wire area 302. The storage device area 301 is provided for placing multiple storage devices 2; the wire area 302 is provided for arranging wires; the circuit board area 303 is provided for installing a circuit board 3. In the present embodiment, the pair of first side plates 32 are disposed at two sides of the storage device area 301, and the pair of first side plates 33 are disposed at two sides of the circuit board area 303.

Figure 6:
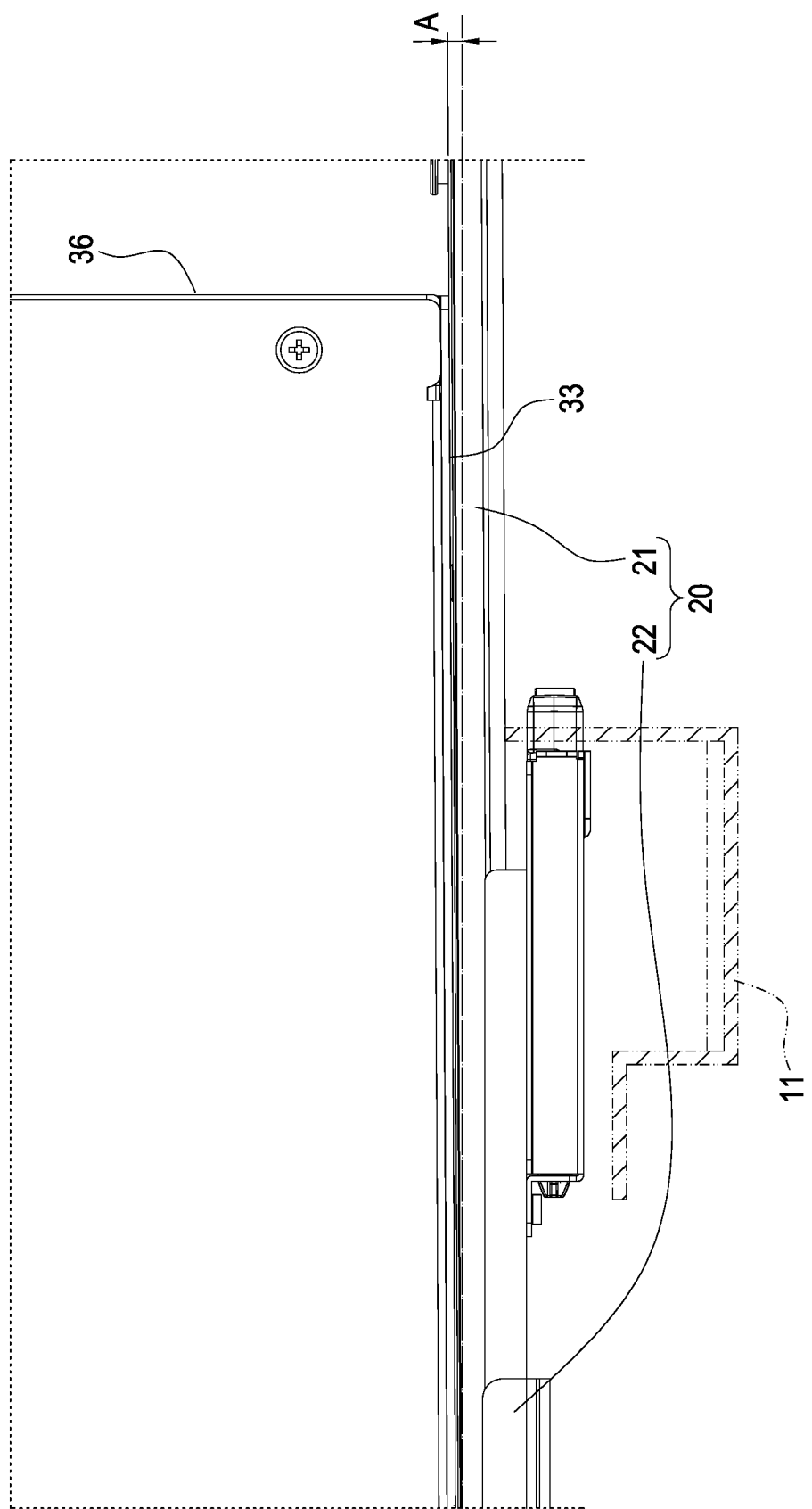
FIG. 6 is a partial enlarged schematic view of chassis and rails of the present invention.

Please refer to FIG. 6, it is worthy of notice that in the server rack with ultra-long chassis 1, the pair of second plates 33 are extended to the rear side of the bottom plate 31 at an oblique angle A to make a gap formed between the second plate 33 and the inner rail 21. Therefore, when the chassis 30 is not stored in the server rack 10, the chassis 30 maintains the gap between the second plate 33 and the inner rail 21. Besides, the gap is gradually enlarged from a side connecting the first side plate 32 to the rear plate 36.

On the other hand, when the chassis 30 is stored in the server rack 10 and moved to the rear side of the supporting columns 11, the ends of the rails 20 are moved without supporting. However, the aforementioned gap can provide a margin for the chassis 10 moving at the rear ends of the rails 20 without pressing the rails 20. Therefore, the rollers of the rail 20 can keep rotating without stopping, so that the chassis 30 can be moved to perform an operation of extraction.

Figure 7:
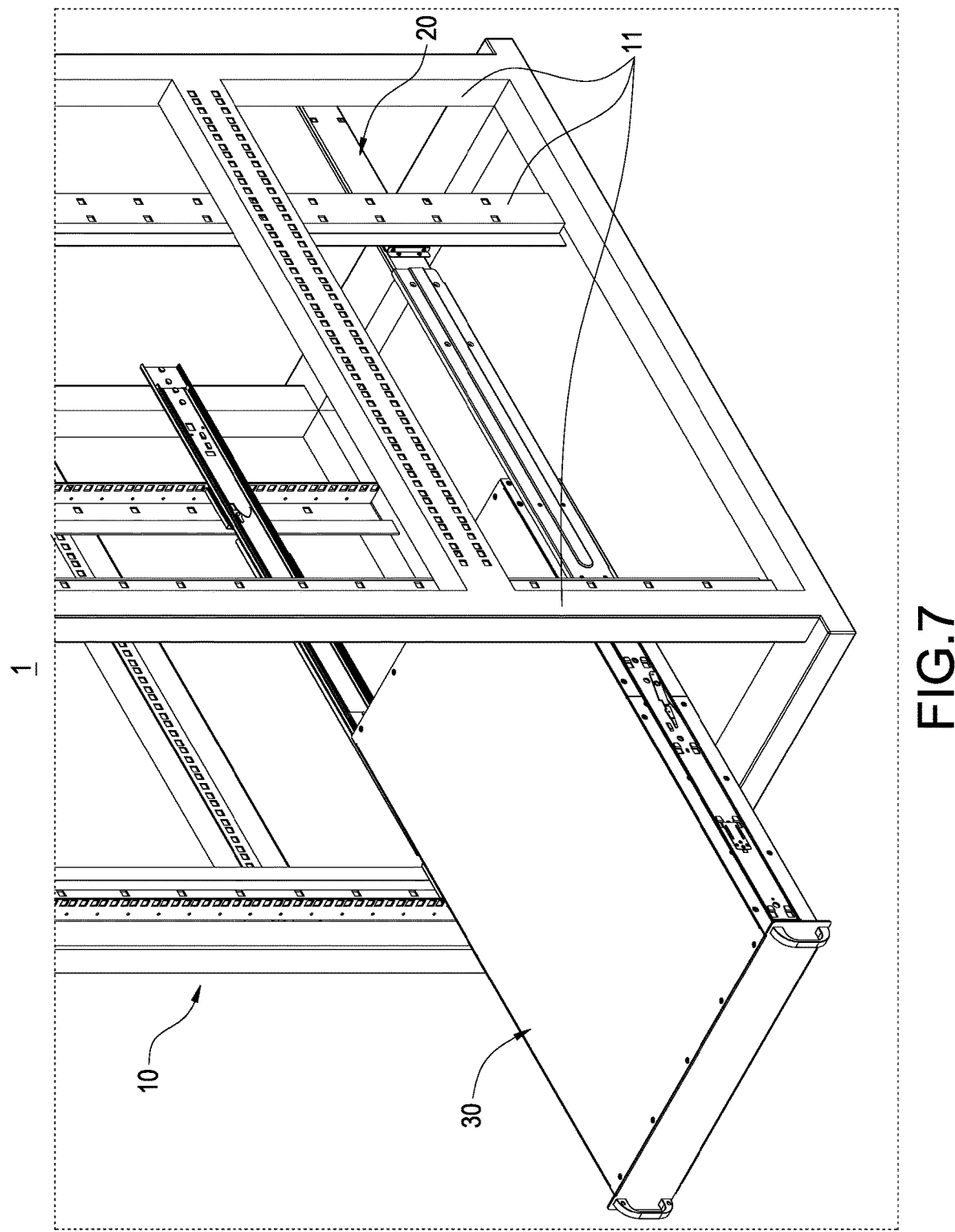
FIG. 7 is an extraction schematic view of sever rack with ultra-long chassis of the present invention.

With referring to FIG. 7, which depict an extraction schematic view of sever rack with ultra-long chassis of the present invention. As shown in the figure, after the server rack with ultra-long chassis structure 1 of the present invention assembling in the manner described above, users can hold the pair of handles 351 of the front plates 35 separately and exert a force to extract the chassis 20 from the server rack 10 for facilitating the maintenance or replacement work.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A server rack with ultra-long chassis, comprising: a server rack including a plurality of supporting columns spaced apart; at least one pair of rails disposed at opposite sides of the server rack correspondingly; and at least one chassis slidably coupled between the at least one pair of rails, and the at least one chassis including a bottom plate, a pair of first side plates and a pair of second side plates; the bottom plate, the pair of first side plates and the pair of second side plates enclosed to form an accommodating space, and the pair of first side plates disposed vertically and in parallel at opposite sides at a front side of the bottom plate; one end of each of the pair of second side plates connected with each of the pair of first side plates correspondingly and an opposite end thereof extended to a rear side of the bottom plate toward an interior of the accommodating space at an oblique angle between 0.5 to 1 degree; and the at least one chassis further includes a cover plate, and the cover plate covers a side of the accommodating space with respect to the bottom plate; ends of the bottom plate and the cover plate are arranged at the oblique angle; and each of the rails includes an inner rail fixed to the supporting columns and an outer rail sleeved outside of the inner rail; the chassis further includes a front plate and a rear plate; the front plate and the rear plate are vertically disposed on opposite sides of the bottom plate; the front plate, the rear plate, the pair of the first side plates and the second side plates enclose a periphery of the accommodating space; and a gap is formed between the second side plate and the inner rail, and the gap is gradually enlarged from a side connecting the first side plate to the rear plate.

2. The server rack with ultra-long chassis according to claim 1, wherein the at least one pair of rails are extended from a supporting column at the front side of the server rack to a supporting column at the rear side of the server rack along a length direction.

3. The server rack with ultra-long chassis according to claim 1, wherein the front plate is provided with a handle.

4. The server rack with ultra-long chassis according to claim 1, wherein the accommodating space includes a storage device area located at the front side of the server rack, a wire area located at the rear side of the server rack, and a circuit board area located between the storage device area and the wire area; the pair of first side plates are disposed at two sides of the storage device area, and the pair of second side plates are disposed at two sides of the circuit board area.

\* \* \* \* \*